US012807500B2

(12) United States Patent
Sumiya et al.

(10) Patent No.: US 12,807,500 B2
(45) Date of Patent: Nov. 24, 2026

(54) SYNTHETIC SINGLE CRYSTAL DIAMOND AND METHOD FOR MANUFACTURING SAME

(71) Applicant: SUMITOMO ELECTRIC INDUSTRIES, LTD., Osaka (JP)

(72) Inventors: Hitoshi Sumiya, Osaka (JP); Jin Hwa Lee, Osaka (JP); Minori Teramoto, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 623 days.

(21) Appl. No.: 18/009,728

(22) PCT Filed: May 14, 2021

(86) PCT No.: PCT/JP2021/018372

§ 371 (c)(1),
(2) Date: Dec. 11, 2022

(87) PCT Pub. No.: WO2022/004150

PCT Pub. Date: Jan. 6, 2022

(65) Prior Publication Data

US 2023/0219818 A1 Jul. 13, 2023

(30) Foreign Application Priority Data

Jun. 30, 2020 (JP) ................................ 2020-113053

(51) Int. Cl.

| | |
|---|---|
| ***C01B 32/26*** | (2017.01) |
| ***C30B 29/04*** | (2006.01) |
| ***C30B 33/04*** | (2006.01) |

(52) U.S. Cl.

CPC .............. *C01B 32/26* (2017.08); *C30B 29/04* (2013.01); *C30B 33/04* (2013.01)

(58) Field of Classification Search

None

See application file for complete search history.

(56) References Cited

U.S. PATENT DOCUMENTS

| | | | |
|---|---|---|---|
| 7,404,399 B2 | 7/2008 | Sumiya et al. | |
| 11,613,826 B2 * | 3/2023 | Sumiya et al. | .......... B01J 3/062 51/307 |

(Continued)

FOREIGN PATENT DOCUMENTS

| | | |
|---|---|---|
| EP | 3312311 A1 | 4/2018 |
| EP | 3699330 A1 | 8/2020 |

(Continued)

OTHER PUBLICATIONS

Ashfold et al.; Nitrogen in Diamond; Chem. Rev., 120, 5745-5794; 2020.*

(Continued)

*Primary Examiner* — Guinever S Gregorio

(74) *Attorney, Agent, or Firm* — Renner, Otto, Boisselle & Sklar, LLP

(57) ABSTRACT

A synthetic single crystal diamond containing nitrogen atoms at a concentration of 100 ppm or more and 1500 ppm or less based on atom numbers, in which the synthetic single crystal diamond contains aggregates each composed of one vacancy and three substitutional nitrogen atoms present adjacent to the vacancy, and a Raman shift λ' $cm^{-1}$ of a peak in a first-order Raman scattering spectrum of the synthetic single crystal diamond and a Raman shift λ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1, $$\lambda' - \lambda \geq 0 \quad \text{Formula 1.}$$

6 Claims, 2 Drawing Sheets

(56) References Cited

U.S. PATENT DOCUMENTS

| | | | |
|---|---|---|---|
| 2020/0062601 A1 | 2/2020 | Ikeda et al. | |
| 2020/0283927 A1 | 9/2020 | Sumiya et al. | |
| 2020/0325596 A1* | 10/2020 | Sumiya | C30B 9/10 |

FOREIGN PATENT DOCUMENTS

| | | | | |
|---|---|---|---|---|
| JP | 2-18980 A | 1/1990 | | |
| JP | 2021099432 A | 7/2021 | | |
| WO | 2017/198662 A1 | 11/2017 | | |
| WO | 2019/077844 A1 | 4/2019 | | |
| WO | WO-2019077888 A1 * | 4/2019 | | C30B 33/02 |

OTHER PUBLICATIONS

WO2019077844A1; translation provided by EPO Apr. 18, 2026.*
A T Collins, Vacancy enhanced aggregation of nitrogen in diamond, Journal of Physics C:Solid State Physics, May 20, 1980, vol. 13, No. 14, 2641-2650.
Non-Final Office Action issued Nov. 5, 2025, for co-pending U.S. Appl. No. 18/568,957.
Office Action for corresponding U.S. Appl. No. 18/568,957 dated Feb. 17, 2026.
U.S. Appl. No. 18/568,957, filed on Dec. 11, 2023, 31 pages.
Non-Final Office Action issued Apr. 21, 2026, for co-pending U.S. Appl. No. 18/568,957.

* cited by examiner

SYNTHETIC SINGLE CRYSTAL DIAMOND AND METHOD FOR MANUFACTURING SAME

TECHNICAL FIELD

The present disclosure relates to a synthetic single crystal diamond and a method for manufacturing the same. The present application claims a priority based on Japanese Patent Application No. 2020-113053 filed on Jun. 30, 2020, the entire content of which is incorporated herein by reference.

BACKGROUND ART

Since single crystal diamond has high hardness, it has been widely used in tools such as cutting tools, grinding tools, and anti-wear tools. Single crystal diamond used in tools includes natural diamond and synthetic diamond.

Most of the natural diamonds (type Ia diamond) contain aggregated nitrogen atoms as impurities. Aggregated nitrogen atoms in the diamond crystal can inhibit the plastic deformation and/or the development of cracks when the diamond is used in a tool. Therefore, natural diamond has high mechanical strength. However, since natural diamond varies greatly in quality and the supply thereof is not stable, there is a limit in using natural diamond in the industrial field.

On the contrary, synthetic diamond is constant in quality and may be supplied stably, and thereby is widely used in the industrial field.

Generally, synthetic diamond (type Ib diamond) contains isolated substitutional nitrogen atoms as impurities. There is a tendency that the mechanical properties of diamond will deteriorate as the concentration of isolated substitutional nitrogen atoms in diamond crystals increases. Therefore, when type Ib synthetic diamond is used in a tool, there is a tendency that the cutting edge thereof is likely to be worn or breakage.

Further, some synthetic diamonds (type IIa diamond) contain almost no nitrogen impurities. Since type IIa synthetic diamond does not contain impurities or crystal defects that inhibit the progress of cracks, when it is used in a tool, there is a tendency that the cutting edge of the tool is likely to be breakage.

Therefore, studies have been carried out on techniques for improving wear resistance and breakage resistance in synthetic diamonds.

For example, Patent Literature 1 (WO 2019/077888) discloses synthetic single crystal diamond having high hardness and excellent breakage resistance.

CITATION LIST

Patent Literature

Patent Literature 1: WO 2019/077888

SUMMARY OF INVENTION

A synthetic single crystal diamond of the present disclosure is a synthetic single crystal diamond containing nitrogen atoms at a concentration of 100 ppm or more and 1500 ppm or less based on atom numbers, in which the synthetic single crystal diamond contains aggregates each composed of one vacancy and three substitutional nitrogen atoms present adjacent to the vacancy, and wherein a Raman shift $\lambda'$ $cm^{-1}$ of a peak in a first-order Raman scattering spectrum of the synthetic single crystal diamond and a Raman shift $\lambda$ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1, $$\lambda'-\lambda\geq 0 \quad \text{Formula 1.}$$

A method for manufacturing the synthetic single crystal diamond is a method for manufacturing the synthetic single crystal diamond described above, the method comprising:

a first step of synthesizing a diamond single crystal containing nitrogen atoms at a concentration of 100 ppm or more and 1500 ppm or less based on atom numbers by a temperature difference process using a solvent metal;

a second step of irradiating the diamond single crystal with one or both of an electron beam and a particle beam with an energy of 100 MGy or more and 1000 MGy or less; and a third step of obtaining the synthetic single crystal diamond by applying a pressure of 3 GPa or more and a temperature of 1850° C. or more and 2300° C. or less for one minute or more and 3600 minutes or less to the diamond single crystal after the second step.

DETAILED DESCRIPTION

Figure 1:
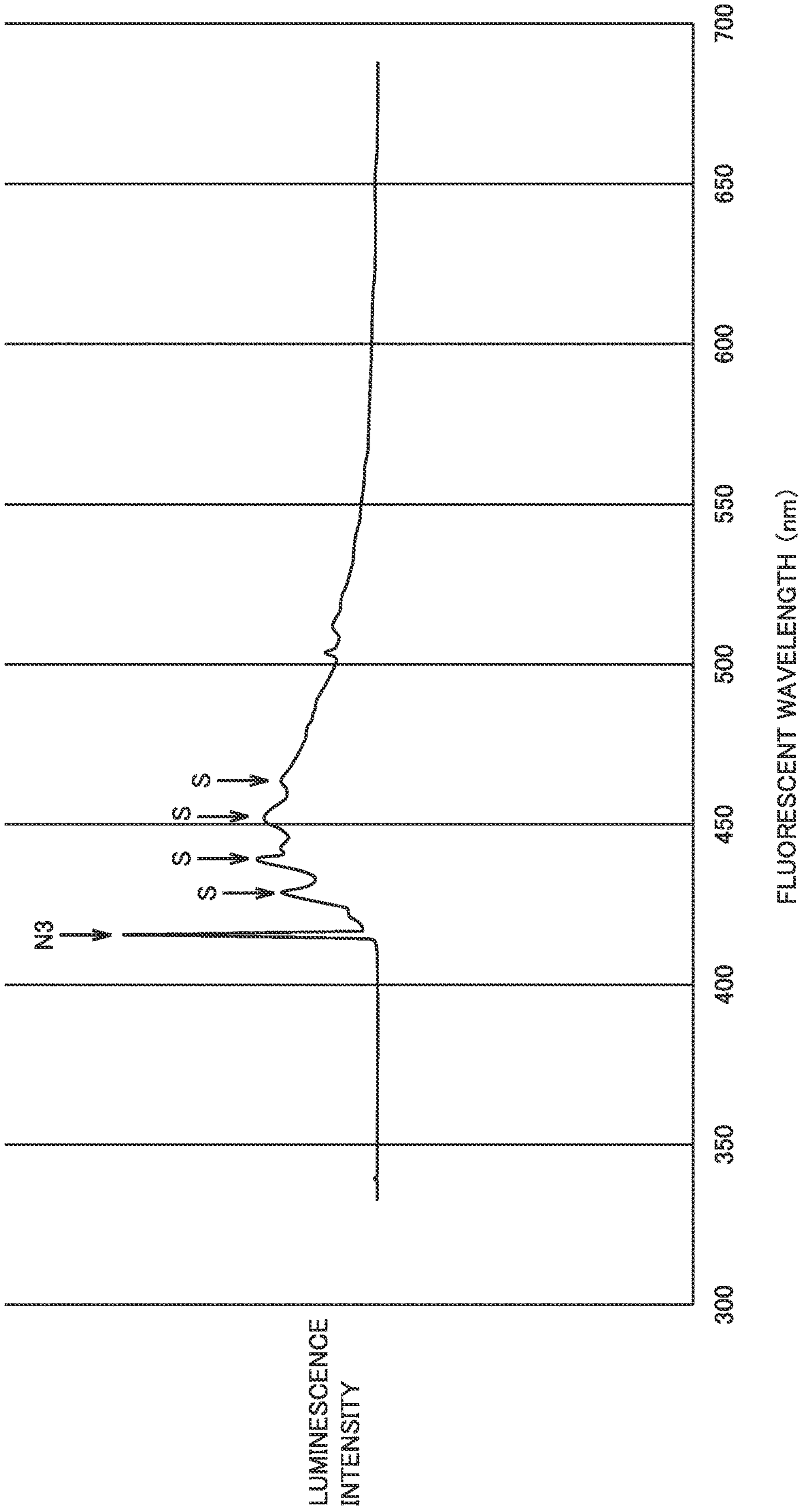
FIG. 1 is an example of a fluorescent spectrum of a synthetic single crystal diamond according to an embodiment of the present disclosure.

Problem to be Solved by the Present Disclosure

Due to a recent demand for long lives of tools, a synthetic single crystal diamond being excellent in terms of wear resistance and breakage resistance is in demand.

Therefore, an objective of the present disclosure is to provide a synthetic single crystal diamond having high hardness and excellent breakage resistance.

Advantageous Effect of the Present Disclosure

The synthetic single crystal diamond of the present disclosure may have high hardness and excellent breakage resistance.

Description of Embodiments

First, a description will be given on each embodiment of the present disclosure.

(1) A synthetic single crystal diamond of the present disclosure is a synthetic single crystal diamond containing nitrogen atoms at a concentration of 100 ppm or more and 1500 ppm or less based on atom numbers, in which the synthetic single crystal diamond contains aggregates each composed of one vacancy and three substitutional nitrogen atoms present adjacent to the vacancy, and a Raman shift λ' $cm^{-1}$ of a peak in a first-order Raman scattering spectrum of the synthetic single crystal diamond and a Raman shift λ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1, $$\lambda'-\lambda\geq 0 \quad \text{Formula 1.}$$

The synthetic single crystal diamond of the present disclosure may have high hardness and excellent breakage resistance.

(2) In a fluorescent spectrum of the synthetic single crystal diamond, a luminescence peak is preferably present in one or both of the fluorescence wavelength range of 415±2 nm and the fluorescence wavelength range of 420 nm or more and 470 nm or less.

In such a case, the synthetic single crystal diamond may have high hardness and excellent breakage resistance.

(3) In an infrared absorption spectrum of the synthetic single crystal diamond, an absorption peak is preferably present in the wave number range of 1370 $cm^{-1}$ or more and 1385 $cm^{-1}$ or less.

In such a case, the synthetic single crystal diamond may have high hardness and excellent breakage resistance.

(4) The Knoop hardness in a <100> direction in a {001} plane of the synthetic single crystal diamond is preferably 100 GPa or more.

In such a case, the synthetic single crystal diamond may have excellent wear resistance.

(5) In a breaking strength test in which a spherical diamond indenter having a tip radius of 50 μm is pressed against a surface of the synthetic single crystal diamond at a loading speed of 100 N/min, a cracking load is preferably 15 N or more.

In such a case, the synthetic single crystal diamond may have excellent breakage resistance.

(6) A method for manufacturing the synthetic single crystal diamond is a method for manufacturing the synthetic single crystal diamond described above, the method comprising:

a first step of synthesizing a diamond single crystal containing nitrogen atoms at a concentration of 100 ppm or more and 1500 ppm or less based on atom numbers by a temperature difference process using a solvent metal;

a second step of irradiating the diamond single crystal with one or both of an electron beam and a particle beam with an energy of 100 MGy or more and 1000 MGy or less; and a third step of obtaining the synthetic single crystal diamond by applying a pressure of 3 GPa or more and a temperature of 1850° C. or more and 2300° C. or less for one minute or more and 3600 minutes or less to the diamond single crystal after the second step.

In such a case, the synthetic single crystal diamond having high hardness and excellent breakage resistance can be obtained.

Details of Embodiments of the Present Disclosure

In the present specification, the expression "A to B" represents the range of upper to lower limits (i.e., A or more and B less). When no unit is indicated for A and a unit is indicated only for B, the unit of A is the same as the unit of B.

<Form of Existence of Nitrogen Atoms in Diamond Crystal>

First, in order to deepen the understanding of the synthetic single crystal diamond of the present disclosure, nitrogen atoms that exist as an impurity in a crystal, which is one of the main factors that determine the performance of diamond will be described.

Nitrogen atoms in a diamond crystal may be classified into isolated substitutional nitrogen atoms, aggregated nitrogen atoms and the like, depending on the form of existence.

Isolated substitutional nitrogen atoms (C center) refer to those atoms that each replaces a carbon atom in a diamond crystal and exists at the position of the carbon atom as an atomic unit.

The present inventors newly assumed that, when isolated substitutional nitrogen atoms are contained in a diamond crystal, local tensile stress is generated in the crystal lattices around the crystal, these act as starting points of plastic deformation or breaking, the hardness decreases and the wear resistance or the breakage resistance deteriorates.

A synthetic single crystal diamond containing isolated substitutional nitrogen atoms shows an absorption peak near the wave number of 1130 $cm^{-1}$ (i.e., the wave number of 1130±2 $cm^{-1}$) in the infrared absorption spectrum measured by Fourier transform infrared spectroscopy.

In a synthetic single crystal diamond containing isolated substituted nitrogen atoms, the nitrogen atoms exist as unpaired electrons, and thereby, the concentration of isolated substituted nitrogen atoms may be measured by ESR (Electron Spin Resonance) analysis. In addition to isolated substitutional nitrogen atoms, the ESR analysis may also detect signals such as crystal defects containing unpaired electrons. In this case, isolated substitutional nitrogen atoms may be identified separately by its g value or its signal relaxation time.

Aggregated nitrogen atoms refer to those atoms that are present in a diamond crystal in an aggregate of two or more nitrogen atoms.

The present inventors newly assumed that aggregated nitrogen atoms in the diamond crystal may suppress plastic deformation or the progress of cracks that is caused when a load is applied to the diamond crystal. The present inventors newly assumed that, when the diamond crystal contains aggregated nitrogen atoms, the wear resistance or breakage resistance of the diamond crystal is greatly improved.

The aggregated nitrogen atoms exist in an A center (2-nitrogen atom pairs), an H3 center (2-nitrogen atom aggregates), an N3 center (3-nitrogen atom aggregates), a B center (4-nitrogen atom aggregates), a B' center or platelets and the like.

The A center (2-nitrogen atom pairs) is an aggregate composed of two nitrogen atoms, and the two nitrogen atoms covalently bond to each other, and each nitrogen atom substitutes for a carbon atom that configures the diamond crystal. A diamond containing the A center (2-nitrogen atom pairs) is called type IaA diamond. A synthetic single crystal diamond containing the A center (2-nitrogen atom pairs) shows an absorption peak near the wave number of 1282 $cm^{-1}$ (i.e., the wave number of 1282±2 $cm^{-1}$) in the infrared absorption spectrum measured by Fourier transform infrared spectroscopy.

The H3 center (2-nitrogen atom aggregates) is an aggregate composed of one vacancy and two nitrogen atoms present adjacent to the vacancy, and each nitrogen atom substitutes for a carbon atom that configures the diamond crystal. In the present specification, "nitrogen atom present adjacent to a vacancy" means a nitrogen atom having the shortest interatomic distance from a carbon atom when the carbon atom is assumed to be present at the position of the vacancy (i.e., nearest neighbor). This is also true for the N3 center and the B center to be described below.

The synthetic single crystal diamond containing the H3 center (2-nitrogen atom aggregates) shows a luminescence peak near the fluorescence wavelength of 503 nm (for example, the fluorescence wavelength of 503±2 nm) in a fluorescent spectrum obtained by irradiating the synthetic single crystal diamond with excitation light that is shorter than approximately 500 nm, for example, excitation light having the wavelength of 325 nm.

The N3 center (3-nitrogen atom aggregates) is an aggregate composed of one vacancy and three nitrogen atoms present adjacent to the vacancy, and each nitrogen atom substitutes for a carbon atom that configures the diamond crystal.

The synthetic single crystal diamond containing the N3 center (3-nitrogen atom aggregates) shows a luminescence peak in one or both of near the fluorescence wavelength of 415 nm (for example, the fluorescence wavelength of 415±2 nm) and the fluorescence wavelength range of 420 nm or more and 470 nm or less in a fluorescent spectrum obtained by irradiating the synthetic single crystal diamond with excitation light that is shorter than approximately 410 nm, for example, excitation light having the wavelength of 325 nm.

The B center (4-nitrogen atom aggregates) is an aggregate composed of one vacancy and four nitrogen atoms present adjacent to the vacancy, and each nitrogen atom substitutes for a carbon atom that configures the diamond crystal.

A diamond containing 4-nitrogen atom aggregates is called type IaB diamond. A synthetic single crystal diamond containing 4-nitrogen atom aggregates shows an absorption peak near the wave number of 1175 $cm^{-1}$ (i.e., the wave number of 1175±2 $cm^{-1}$) in the infrared absorption spectrum measured by Fourier transform infrared spectroscopy.

The B' center (also called platelets) is a plate-like aggregate composed of five or more nitrogen atoms and interstitial carbon and is incorporated into the crystal as an inclusion.

A diamond containing the B' center (platelets) is called type IaB' diamond. A synthetic single crystal diamond containing the B' center (platelets) shows an absorption peak at the wave number of 1358 $cm^{-1}$ or more and 1385 $cm^{-1}$ or less in the infrared absorption spectrum measured by Fourier transform infrared spectroscopy.

As a result of intensive studies of the aggregated nitrogen atoms that can improve the characteristics of the synthetic single crystal diamond, the present inventors newly found that the N3 center include a smallest amount of crystal strain and have a stable structure. In addition, the present inventors newly found that the N3 center is dominantly formed in the synthetic single crystal diamond, whereby it is possible to further improve the mechanical characteristics such as hardness, strength, wear resistance and breakage resistance of the synthetic single crystal diamond and completed the present disclosure.

Hereinafter, specific examples of the synthetic single crystal diamond of the present disclosure and a method for manufacturing the same will be described with reference to the drawings. In the drawings of the present disclosure, the same reference sign indicates the same portions or equivalent portions. Further, dimensional relationships of lengths, widths, thicknesses, depths and the like have been modified as appropriate in order for the clarification and simplification of the drawings and do not necessarily indicate actual dimensional relationships.

Embodiment 1: Synthetic Single Crystal Diamond

A synthetic single crystal diamond of the present disclosure is a synthetic single crystal diamond containing nitrogen atoms at a concentration of 100 ppm or more and 1500 ppm or less based on atom numbers, in which the synthetic single crystal diamond contains aggregates each composed of one vacancy and three substitutional nitrogen atoms present adjacent to the vacancy, and a Raman shift λ' $cm^{-1}$ of a peak in a first-order Raman scattering spectrum of the synthetic single crystal diamond and a Raman shift λ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1, $$\lambda'-\lambda\geq 0 \qquad \text{Formula 1.}$$

The synthetic single crystal diamond of the present disclosure may have high hardness and breakage resistance. The reason therefor is not clear, but is assumed as described in the following (i) to (iii).

(i) The synthetic single crystal diamond of the present disclosure contains nitrogen atoms at a concentration of 100 ppm or more and 1500 ppm or less based on atom numbers. In such a case, the nitrogen atoms in the synthetic single crystal diamond are likely to aggregate. Therefore, the synthetic single crystal diamond is likely to contain aggregated nitrogen atoms, and the wear resistance or breakage resistance of the diamond crystal improve.

(ii) The synthetic single crystal diamond of the present disclosure contains aggregates each composed of one vacancy and three substitutional nitrogen atoms present adjacent to the vacancy. That is, the synthetic single crystal diamond of the present disclosure contains the N3 center. The N3 center may suppress plastic deformation or the progress of cracks that is caused when a load is applied to the synthetic single crystal diamond. Therefore, the synthetic single crystal diamond improves in breakage resistance.

Furthermore, among aggregated nitrogen atoms, the N3 center include a smallest amount of crystal strain and have a stable structure. Therefore, the synthetic single crystal diamond of the present disclosure containing the N3 center may have high hardness and excellent wear resistance.

(iii) A Raman shift λ' $cm^{-1}$ of a peak in a first-order Raman scattering spectrum of the synthetic single crystal diamond of the present disclosure and a Raman shift λ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1.

$$\lambda'-\lambda\geq 0 \quad \text{Formula 1.}$$

In the synthetic single crystal diamond of the present disclosure, the formula 1 is satisfied, tensile stress is rarely present, and compressive stress is generated. Therefore, even when isolated substitutional nitrogen atoms are present, the isolated substitutional nitrogen atoms do not act as starting points of plastic deformation or breaking. Therefore, the synthetic single crystal diamond of the present disclosure may have excellent strength and breakage resistance. The relationship between the formula 1 and the internal stress of the synthetic single crystal diamond will be described in detail below.

<Nitrogen Atomic Concentration>

The synthetic single crystal diamond of the present disclosure contains nitrogen atoms at a concentration of 100 ppm or more and 1500 ppm or less based on atom numbers (hereinafter, also referred to as "nitrogen atomic concentration"). When the nitrogen atomic concentration is 100 ppm or more, the nitrogen atoms in the synthetic single crystal diamond are likely to form aggregated nitrogen atoms. When the nitrogen atomic concentration is 1500 ppm or less, the synthetic single crystal diamond may have high hardness and excellent breakage resistance.

The lower limit of the nitrogen atomic concentration in the synthetic single crystal diamond may be adjusted to 100 ppm or more, 200 ppm or more or 300 ppm or more. The upper limit of the nitrogen atomic concentration in the synthetic single crystal diamond may be adjusted to 1500 ppm or less, 1400 ppm or less or 1300 ppm or less. The nitrogen atomic concentration in the synthetic single crystal diamond may be adjusted to 100 ppm or more and 1500 ppm or less, 100 ppm or more and 1400 ppm or less, 100 ppm or more and 1300 ppm or less, 200 ppm or more and 1500 ppm or less, 200 ppm or more and 1400 ppm or less, 200 ppm or more and 1300 ppm or less, 300 ppm or more and 1500 ppm or less, 300 ppm or more and 1400 ppm or less and 300 ppm or more and 1300 ppm or less.

The nitrogen atomic concentration in the synthetic single crystal diamond may be measured by secondary ion mass spectrometry (SIMS).

<Aggregated Nitrogen Atoms>

(N3 Center)

The synthetic single crystal diamond of the present disclosure contains aggregates each composed of one vacancy and three substitutional nitrogen atoms present adjacent to the vacancy. That is, the synthetic single crystal diamond of the present disclosure contains the N3 center. The N3 center may suppress plastic deformation or the progress of cracks that is caused when a load is applied to the synthetic single crystal diamond. Therefore, the synthetic single crystal diamond improves in breakage resistance.

Furthermore, among aggregated nitrogen atoms, the N3 center include a smallest amount of crystal strain and have a stable structure. Therefore, the synthetic single crystal diamond of the present disclosure containing the N3 center may have high hardness and excellent wear resistance.

Whether or not the synthetic single crystal diamond contains the N3 center may be confirmed from the fluorescent spectrum obtained by irradiating the synthetic single crystal diamond with excitation light that is shorter than approximately 410 nm, for example, excitation light having the wavelength of 325 nm. Specifically, in a fluorescent spectrum obtained by irradiating the synthetic single crystal diamond with excitation light having the wavelength of 325 nm, when a luminescence peak is present in one or both of the fluorescence wavelength range of 415±2 nm and the fluorescence wavelength range of 420 nm or more and 470 nm or less, the synthetic single crystal diamond is determined to contain the N3 center.

The peak in the fluorescence wavelength range of 415±2 nm is a luminescence peak corresponding to the zero-phonon line of the N3 center, and the luminescence peak in the fluorescence wavelength range of 420 nm or more and 470 nm or less is a luminescence peak corresponding to the subband (phonon side band) of the N3 center. The luminescence peak in the fluorescence wavelength range of 420 nm or more and 470 nm or less is observed as one or more mountain-like peaks in the range. At least one of the mountain-like peaks indicates the maximum intensity in the range.

An example of the fluorescent spectrum obtained by irradiating the synthetic single crystal diamond according to an embodiment of the present disclosure (hereinafter, also referred to as "the present embodiment") with excitation light having the wavelength of 325 nm. In FIG. 1, the X axis indicates the fluorescent wavelength (nm), and the Y axis indicates the luminescence intensity. In the fluorescent spectrum illustrated in FIG. 1, a luminescence peak in the fluorescent wavelength range of 415±2 nm (indicated by the arrow N3) and luminescence peaks in the fluorescent wavelength range of 420 nm or more and 470 nm or less (indicated by the arrows S) are present.

Whether or not the synthetic single crystal diamond contains the N3 center may also be confirmed from the ultraviolet-visible spectral spectrum. Specifically, when an absorption peak having the wavelength of 393 nm is present in the ultraviolet-visible spectral spectrum, the synthetic single crystal diamond is determined to contain the N3 center.

(B' Center (Platelets))

In the infrared absorption spectrum of the synthetic single crystal diamond of the present disclosure, an absorption peak is preferably present in the wave number range of 1370 $cm^{-1}$ or more and 1385 $cm^{-1}$ or less. The absorption peak is derived from the B' center (platelets) in the synthetic single crystal diamond. The absorption peak is derived from the B' center (platelets) in the synthetic single crystal diamond.

When an absorption peak is present in the wave number range of 1370 $cm^{-1}$ or more and 1385 $cm^{-1}$ or less in the infrared absorption spectrum of the synthetic single crystal diamond, the aggregate of the nitrogen atoms that are contained in the B' center (platelets) has an moderate size, may inhibit plastic deformation or the progress of cracks and is unlikely to act as a starting point of breaking. Therefore, the synthetic single crystal diamond may have high hardness and excellent strength.

Generally, the synthetic single crystal diamond containing the B' center (platelets) shows an absorption peak at the wave number of 1358 $cm^{-1}$ or more and 1385 $cm^{-1}$ or less in the infrared absorption spectrum. However, when an absorption peak is present in the range smaller than the wave number of 1370 $cm^{-1}$ (the wave number of 1358 $cm^{-1}$ or more and less than 1370 $cm^{-1}$), the B' center (platelets) aggregate in the crystal is too large and acts as a starting point of breaking, which is not preferable. Therefore, in the infrared absorption spectrum of the synthetic single crystal diamond, an absorption peak is preferably not present in the wave number range of 1358 $cm^{-1}$ or more and less than 1370 $cm^{-1}$.

(Other Aggregated Nitrogen Atoms)

The synthetic single crystal diamond of the present disclosure may contain the A center (2-nitrogen atom pairs), the H3 center (2-nitrogen atom aggregates), the B center (4-nitrogen atom aggregates) and the B' center. An aggregate of nitrogen atoms that is contained in these can suppress the propagation of cracks in single crystal diamond. Therefore, the synthetic single crystal diamond may have excellent breakage resistance.

Whether or not the synthetic single crystal diamond contains the A center may be confirmed from the infrared absorption spectrum measured by Fourier transform infrared spectroscopy. Specifically, when an absorption peak is present near the wave number of 1282 $cm^{-1}$ (i.e., the wave number of 1282±2 $cm^{-1}$) in the infrared absorption spectrum, the synthetic single crystal diamond is determined to contain the A center.

Whether or not the synthetic single crystal diamond contains the H3 center may be confirmed from the fluorescent spectrum obtained by irradiating the synthetic single crystal diamond with excitation light having the wavelength of 325 nm. Specifically, when a luminescence peak is present near the fluorescent wavelength of 503 nm (i.e., 503±2 nm) in the fluorescent spectrum, the synthetic single crystal diamond is determined to contain the H3 center.

Whether or not the synthetic single crystal diamond contains the B center may be confirmed from the infrared absorption spectrum measured by Fourier transform infrared spectroscopy. Specifically, when an absorption peak is present near the wave number of 1175 $cm^{-1}$ (i.e., the wave number of 1175±2 $cm^{-1}$) in the infrared absorption spectrum, the synthetic single crystal diamond is determined to contain the B center.

<Isolated Substitutional Nitrogen Atoms>

The synthetic single crystal diamond of the present disclosure preferably does not contain the isolated substitutional nitrogen atoms (C center). In such a case, the synthetic single crystal diamond of the present disclosure may have high hardness and excellent breakage resistance.

Whether or not the synthetic single crystal diamond contains isolated substitutional nitrogen atoms may be determined from the infrared absorption spectrum measured by Fourier transform infrared spectroscopy. Single crystal diamond containing isolated substitutional nitrogen atoms shows a peak near the wave number of 1130 $cm^{-1}$ (i.e., 1130±2 $cm^{-1}$) in the infrared absorption spectrum measured by Fourier transform infrared spectroscopy. Therefore, it may be determined that the synthetic single crystal diamond does not contain isolated substitutional nitrogen atoms by confirming that an absorption peak derived from isolated substitutional nitrogen atoms is absent in the wave number range of 1130±2 $cm^{-1}$ in the infrared absorption spectrum of the synthetic single crystal diamond.

In the infrared absorption spectrum, if there is a shoulder of the absorption peak of the aggregated nitrogen atoms other than the isolated substitutional nitrogen atoms in the wave number range of 1130±2 $cm^{-1}$ and it is unclear whether the shoulder is an absorption peak derived from isolated substitutional nitrogen atoms, the presence or absence of isolated substitutional nitrogen atoms may be determined by the ESR analysis. When there is no isolated substitutional nitrogen atom in the synthetic single crystal diamond, there are no unpaired electrons in the synthetic single crystal diamond. Therefore, when the ESR analysis is performed, no signal is detected from the synthetic single crystal diamond. As a result, it may be confirmed that there is no isolated substitutional nitrogen atom in the synthetic single crystal diamond.

<Infrared Absorption Spectrum>

When the C center, the A center, the B center and the B' center (platelets) are present in the diamond crystal, in the infrared absorption spectrum of the diamond crystal measured by Fourier transform infrared spectroscopy, an absorption peak derived from each center is observed. Since the waveform of each center overlaps the waveform of another center, the presence or absence or amount of each center may not be specified only from the intensity value at each wave number. On the other hand, the determination of the presence or absence of each center and the qualitative evaluation of the content ratio of each center are possible by considering the approximate waveform of each center from the relative comparison of the intensities of individual wave numbers.

<First-Order Raman Scattering Spectrum>

The Raman shift λ' $cm^{-1}$ of a peak in the first-order Raman scattering spectrum of the synthetic single crystal diamond of the present disclosure and the Raman shift λ $cm^{-1}$ of a peak in the first-order Raman scattering spectrum of a synthetic type IIa single crystal diamond containing nitrogen atoms at a concentration of 1 ppm or less based on atom numbers show the relationship of the following formula 1.

$$\lambda'-\lambda\geq 0 \quad \text{Formula 1.}$$

The state of internal stress in the crystal is one of the factors that affect the wear resistance or breakage resistance of diamond. When tensile stress is present in the diamond crystal, the plastic deformation or breaking of the diamond crystal is likely to occur from sites where the tensile stress has been generated, and the wear resistance or breakage resistance deteriorates. On the contrary, when compressive stress is present in the diamond crystal, the breakage resistance improves. Therefore, the wear resistance or breakage resistance of the single crystal diamond may be improved by adjusting the state of internal stress in the diamond crystal such that tensile stress becomes as small as possible or compressive stress becomes dominant.

The state of internal stress in the synthetic single crystal diamond can be evaluated by comparing the Raman shift λ' ($cm^{-1}$) of a peak in the first-order Raman scattering spectrum of the synthetic single crystal diamond and the Raman shift λ ($cm^{-1}$) of a peak in the first-order Raman scattering spectrum of a synthetic type IIa single crystal diamond containing nitrogen atoms at a concentration of 1 ppm or less based on atom numbers (hereinafter, also referred to as standard sample or synthetic type IIa single crystal diamond). Specifically, the state of internal stress in the synthetic single crystal diamond can be evaluated by the magnitude of the peak position shift amount represented by the difference (λ'−λ) between the λ' and the λ. The reason therefor will be described below.

The synthetic type IIa single crystal diamond that is used as the standard sample means a high-purity single crystal diamond having no lattice defects or internal strain that is synthesized by the temperature different method at a high temperature under high pressure. For example, the synthetic type IIa single crystal diamond is on sale as a high-purity type IIa single crystal diamond manufactured by Sumitomo Electric Industries, Ltd. In the synthetic type IIa single crystal diamond, since the nitrogen atomic concentration based on atom numbers is 1 ppm or less or 0 ppm or more and 1 ppm or less and nitrogen atoms are rarely contained, no internal stress is present in the diamond crystal. Further, the synthetic type IIa single crystal diamond exhibits one sharp and strong peak in the first-order Raman scattering spectrum. Generally, the Raman shift of this peak appears in the range of 1332 $cm^{-1}$ to 1333 $cm^{-1}$. The value of the Raman shift varies according to the temperature of the environment at the time of measurement. In the present specification, the Raman shift is the value measured at room temperature (20° C. or more and 25° C. or less).

When isolated substitutional nitrogen atoms are present in the diamond crystal, the Raman shift shifts toward the low-frequency side more than that of the synthetic type IIa single crystal diamond. At this time, tensile stress derived from the isolated substitutional nitrogen atoms is generated in the diamond crystal. On the other hand, when isolated substitutional nitrogen atoms are not present, but aggregated nitrogen atoms are present in the diamond crystal, the Raman shift shifts toward the high-frequency side more than that of the synthetic type IIa single crystal diamond. At this time, tensile stress is not generated or compressive stress is generated in the diamond crystal.

Therefore, the state of internal stress in the synthetic single crystal diamond may be evaluated by comparing the values of the Raman shift λ' ($cm^{-1}$) in the synthetic single crystal diamond and the Raman shift λ ($cm^{-1}$) of the synthetic type IIa single crystal diamond.

As a result of intensive studies of the relationship between the magnitude of the peak position shift amount represented by the difference (λ'−λ) between λ' ($cm^{-1}$) and λ ($cm^{-1}$) and the breakage resistance and hardness of the synthetic single crystal diamond based on the above-described finding, the present inventors found that, when (λ'−λ) exhibits the relationship of the following formula 1, the synthetic single crystal diamond has high hardness and also has excellent breakage resistance.

$$\lambda'-\lambda \geq 0 \qquad \text{Formula 1.}$$

When (λ'−λ) satisfies the relationship of the formula 1, the amount of the isolated substitutional nitrogen atoms in the synthetic single crystal diamond is sufficiently reduced, and the synthetic single crystal diamond may have excellent breakage resistance and high hardness. The lower limit of (λ'−λ) may be adjusted to 0 or more, 0.05 or more, 0.1 or more, 0.15 or more, 0.2 or more, 0.25 or more or 0.3 or more. The upper limit of (λ'−λ) may be adjusted to 2 or less or 1 or less. (λ'−λ) may be adjusted to 0 or more and 2 or less, 0 or more and 1 or less, 0.05 or more and 2 or less, 0.05 or more and 1 or less, 0.1 or more and 2 or less, 0.1 or more and 1 or less, 0.15 or more and 2 or less, 0.15 or more and 1 or less, 0.2 or more and 2 or less, 0.2 or more and 1 or less, 0.25 or more and 2 or less, 0.25 or more and 1 or less, 0.3 or more and 2 or less, or 0.3 or more and 1 or less.

The Raman shifts of the peaks of the synthetic single crystal diamond and the standard sample in the first-order Raman scattering spectrum may be measured with a microscopic Raman spectrometer. The Raman shifts are measured at room temperature (20° C. or more and 25° C. or less) using a laser having a wavelength of 532 nm as excitation light.

An arbitrary surface of the synthetic single crystal diamond is polished, and the Raman shift (λ') of a peak in the first-order Raman scattering spectrum of the polished surface is measured. An arbitrary surface of the synthetic high-purity type IIa single crystal diamond, which is the standard sample, is polished, and the Raman shift (λ) of a peak in the first-order Raman scattering spectrum of the polished surface is measured.

λ' and λ are the wave numbers where the first-order Raman scattering spectrum signal becomes strongest. The peak shape is evaluated after the peak is fitted using the Lorentzian function or the Gaussian function. At the time of measuring the sample and the standard sample, the temperature change of the detector and the optical system of the Raman spectrometer is suppressed to be ±1° C. or less.

The peak position shift amount may be determined by calculating the value of (λ'−λ).

<Knoop Hardness>

The Knoop hardness of the synthetic single crystal diamond according to the present embodiment in a <100> direction in a {001} plane (hereinafter, also referred to as the {001}<100> Knoop hardness) is preferably 100 GPa or more. In the present specification, a generic plane orientation including any crystallographically equivalent plane orientation is indicated by { }, and a generic direction including any crystallographically equivalent direction is indicated by < >. A synthetic single crystal diamond having a {001}<100> Knoop hardness of 100 GPa or more has higher hardness and superior wear resistance than natural diamond containing nitrogen.

The lower limit of the {001}<100> Knoop hardness may be adjusted to 105 GPa or more, 110 GPa or more or 115 GPa or more. The upper limit of the {001}<100> Knoop hardness is not particularly limited but may be adjusted to, for example, 150 GPa or less from the production viewpoint. The {001}<100> Knoop hardness of the synthetic single crystal diamond may be adjusted to 100 GPa or more and 150 GPa or less, 105 GPa or more and 150 GPa or less, 110 GPa or more and 150 GPa or less or 115 GPa or more and 150 GPa or less.

A method of evaluating the {001}<100> Knoop hardness (hereinafter, also referred to as HK having a unit of GPa) will be described. First, an indentation is made in the <100> direction in the {001} plane of the synthetic single crystal diamond with a load of 4.9 N. The long diagonal line "a" (μm) of the obtained indentation is measured, and the {001}<100> Knoop hardness (HK) is calculated by the following expression A.

$$HK=14229\times 4.9/a^2 \qquad \text{Expression A}$$

<Cracking Load>

Preferably, the synthetic single crystal diamond of the present disclosure has a cracking load of 15 N or more in a breaking strength test in which a spherical diamond indenter having a tip radius (R) of 50 μm is pressed against a surface of the synthetic single crystal diamond at a loading speed of 100 N/min. When the cracking load is 15 N or more, the synthetic single crystal diamond has excellent breaking strength and breakage resistance, and when it is used as a material in a cutting tool, the breakage of the cutting edge is unlikely to occur.

The lower limit of the cracking load may be adjusted to 17 N or more, 20 N or more, 25 N or more or 30 N or more. The upper limit of the cracking load is not particularly limited, but from the viewpoint of production, it is, for example, 50 N or less. The cracking load of the synthetic single crystal diamond may be adjusted to 15 N or more and 50 N or less, 17 N or more and 50 N or less, 20 N or more and 50 N or less, 25 N or more and 50 N or less or 30 N or more and 50 N or less.

The breaking strength test is performed under the following conditions. A spherical diamond indenter with a tip radius (R) of 50 μm is pressed against the sample, a load is applied to the sample at a loading speed of 100 N/min, and the load at the moment when a crack occurs in the sample (cracking load) is measured. The moment when a crack occurs is measured using an AE sensor. The larger the cracking load, the higher the strength of the sample and the better the breakage resistance.

When an indenter with a tip radius (R) smaller than 50 μm is used as the measuring indenter, the sample is plastically deformed before a crack is generated, and the strength against cracks may not be measured accurately. On the contrary, an indenter with a tip radius (R) larger than 50 μm may be used to perform the measurement, but in this case, a greater load is required until a crack occurs and the contact area between the indenter and the sample increases, which may affect the measurement accuracy due to the surface accuracy of the sample and may greatly affect the crystal orientation of the crystal. Therefore, it is preferable to use an indenter with a tip radius (R) of 50 μm in the breaking strength test for a synthetic single crystal diamond.

Embodiment 2: Method of Producing Synthetic Single Crystal Diamond

An example of a method of producing the synthetic single crystal diamond of Embodiment 1 will be described below. The synthetic single crystal diamond of Embodiment 1 is not limited to a synthetic single crystal diamond produced by the following manufacturing method and may be a synthetic single crystal diamond produced by a different manufacturing method.

A method for manufacturing a synthetic single crystal diamond of the present disclosure is a method for manufacturing the synthetic single crystal diamond of Embodiment 1 and includes: a first step of synthesizing a diamond single crystal containing nitrogen atoms at a concentration of 100 ppm or more and 1500 ppm or less based on atom numbers by a temperature difference process using a solvent metal (hereinafter also referred to as a first step); a second step of irradiating the diamond single crystal with one or both of an electron beam and a particle beam with an energy of 100 MGy or more and 1000 MGy or less (hereinafter also referred to as a second step); and a third step of obtaining a synthesis single crystal diamond by applying a pressure of 3 GPa or more and a temperature of 1850° C. or more and 2300° C. or less for one minute or more and 3600 minutes or less (hereinafter, also referred to as a third step) to the irradiated diamond single crystal.

(First Step)

Figure 2:
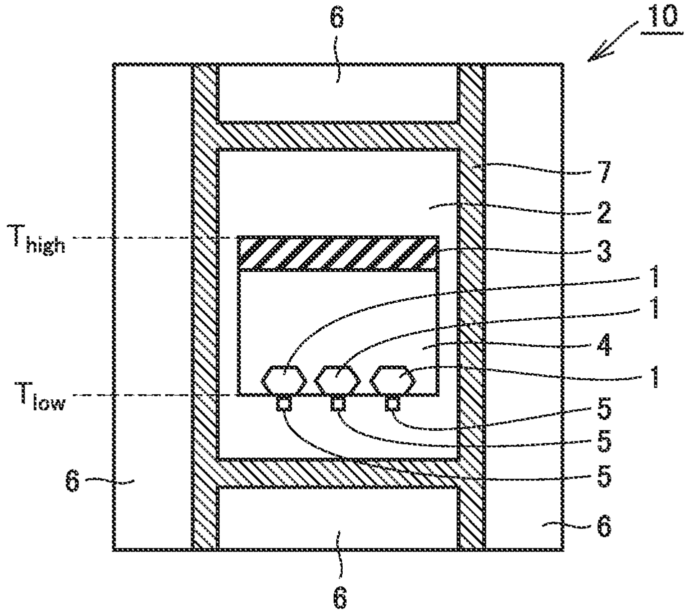
FIG. 2 is a cross-sectional view schematically illustrating an example configuration of a sample chamber used for manufacturing a synthetic single crystal diamond according to an embodiment of the present disclosure.

A diamond single crystal may be produced by a temperature difference process in a sample chamber having a configuration illustrated in FIG. 2, for example.

As illustrated in FIG. 2, in a sample chamber 10 used for the production of a diamond single crystal 1, an insulator 2, a carbon source 3, a solvent metal 4 and seed crystals 5 are placed in a space surrounded by a graphite heater 7, and a pressure medium 6 is placed outside graphite heater 7. The temperature difference process is a synthesis process in which a temperature gradient in the vertical direction is provided inside sample chamber 10, carbon source 3 is placed in a high temperature portion ($T_{high}$) and seed crystals 5 are placed in a low temperature portion ($T_{low}$), the solvent metal 4 is placed between carbon source 3 and seed crystals 5, and diamond single crystal 1 is grown on each of seed crystals 5 by maintaining the temperature equal to or more than a temperature at which solvent metal 4 is dissolved and the pressure equal to or more than a pressure at which the diamond is thermally stable.

As carbon source 3, diamond powder is preferably used. In addition, graphite (black lead) or pyrolytic carbon may also be used. As solvent metal 4, at least one metal selected from iron (Fe), cobalt (Co), nickel (Ni), manganese (Mn) and the like, or an alloy containing these metals may be used.

Carbon source 3 or solvent metal 4 may include a nitrogen source which is added as a simple substance or a mixture of, for example, a nitride such as iron nitride ($Fe_2N$, $Fe_3N$), aluminum nitride (AlN), phosphorus nitride ($P_3N_4$) or silicon nitride ($Si_3N_4$), or an organic nitrogen compound such as melamine or sodium azide. Further, as the nitrogen source, diamond or graphite containing a large amount of nitrogen may be added. Thereby, the synthesized diamond single crystal may contain nitrogen atoms, and the nitrogen atoms in the diamond single crystal exist mainly as isolated substitutional nitrogen atoms.

The concentration of the nitrogen source in the carbon source 3 or the solvent metal 4 may be adjusted so that the nitrogen atomic concentration based on atom numbers in the synthesized diamond single crystal is 100 ppm or more and 1500 ppm or less. For example, in the carbon source, the nitrogen atomic concentration derived from the nitrogen source based on atom numbers may be adjusted to 200 ppm or more and 3000 ppm or less. In the case of the solvent metal, for example, when the solvent metal is an alloy composed of iron, cobalt and nickel and the nitrogen source is $Fe_3N$, the concentration of the nitrogen source may be adjusted to 0.01 mass % or more and 0.2 mass % or less.

Solvent metal 4 may further contain at least one element selected from the group consisting of titanium (Ti), vanadium (V), chromium (Cr), manganese (Mn), copper (Cu), zirconium (Zr), niobium (Nb), molybdenum (Mo), ruthenium (Ru), rhodium (Rh), hafnium (Hf), tantalum (Ta), tungsten (W), osmium (Os), iridium (Ir), and platinum (Pt).

(Second Step)

Next, the obtained diamond single crystal is irradiated with one or both of an electron beam and a particle beam with an energy of 100 MGy or more and 1000 MGy or less. As a result, lattice defects are introduced into the diamond single crystal, and thereby vacancies are formed.

If the amount of irradiation energy is less than 100 MGy, the introduction of lattice defects may be insufficient. On the contrary, if the amount of energy is greater than 1000 MGy, excessive vacancies may be formed, which may greatly deteriorate the crystallinity. Therefore, the amount of energy is preferably 100 MGy or more and 1000 MGy or less.

As the particle beam, a neutron beam or a proton beam may be used. The irradiation conditions are not particularly limited as long as the amount of energy applied to the diamond single crystal is 100 MGy or more and 1000 MGy or less. For example, in the case of using an electron beam, the irradiation energy may be 4.6 MeV or more and 4.8 MeV or less, the current may be 2 mA or more and 5 mA or less, and the irradiation time may be 30 hours or more and 45 hours or less.

(Third Step)

Next, a pressure of 3 GPa or more is applied to the diamond single crystal after the second step at a temperature of 1850° C. or more and 2300° C. or less for one minute or more and 3600 minutes or less, thereby obtaining a synthetic single crystal diamond. Thereby, the isolated substitutional nitrogen atoms in the diamond single crystal move through the vacancies and aggregate with each other to form aggregated nitrogen atoms.

When the temperature of the third step is 1850° C. or more, the movement of the nitrogen atoms in the diamond single crystal is promoted and the formation of aggregates (N3 centers) each composed of one vacancy and three substitutional nitrogen atoms present adjacent to the vacancy is promoted. When the temperature of the third step is lower than 1850° C., the formation of the N3 centers is difficult. The upper limit of the temperature of the third step is preferably 2300° C. or less from the viewpoint of costs and productivity.

On the contrary, when the diamond single crystal is heated to 1850° C. or more under normal pressure, the diamond single crystal will be graphitized. As a result of intensive studies, the present inventors newly found that the movement of the nitrogen atoms in the diamond single crystal can be promoted without graphitizing the diamond single crystal by applying the temperature of 1850° C. or more under a high pressure of 3 GPa or more for one minute or more and 3600 minutes or less.

The time during which the temperature of 1850° C. or more is applied to the diamond single crystal under a high pressure of 3 GPa or more is one minute or more and 3600 minutes or less. The time during which the temperature of 1850° C. or more is applied to the diamond single crystal under a high pressure of 3 GPa or more may be adjusted to 60 minutes or more and 360 minutes or less. At this time, the pressure may be adjusted to 3 GPa or more and 20 GPa or less.

The second step and the third step each may be performed once as one cycle, and the cycle may be repeated twice or more, which may promote the aggregation of isolated substitutional nitrogen atoms in the diamond single crystal.

[Addendum 1]

The synthetic single crystal diamond of the present disclosure preferably does not contain the isolated substitutional nitrogen atoms. In such a case, the hardness and breakage resistance of the synthetic single crystal diamond further improve.

[Addendum 2]

In the infrared absorption spectrum of the synthetic single crystal diamond of the present disclosure, an absorption peak is preferably not present in the wave number range of 1130±2 $cm^{-1}$. In such a case, the hardness and breakage resistance of the synthetic single crystal diamond further improve.

[Addendum 3]

In the infrared absorption spectrum of the synthetic single crystal diamond of the present disclosure, an absorption peak is preferably not present in the wave number range of 1358 $cm^{-1}$ or more and less than 1370 $cm^{-1}$. In such a case, the hardness and breakage resistance of the synthetic single crystal diamond further improve.

[Addendum 4]

The nitrogen atomic concentration in the synthetic single crystal diamond of the present disclosure may be adjusted to 100 ppm or more and 1400 ppm or less.

The nitrogen atomic concentration in the synthetic single crystal diamond of the present disclosure may be adjusted to 100 ppm or more and 1300 ppm or less.

The nitrogen atomic concentration in the synthetic single crystal diamond of the present disclosure may be adjusted to 200 ppm or more and 1500 ppm or less.

The nitrogen atomic concentration in the synthetic single crystal diamond of the present disclosure may be adjusted to 200 ppm or more and 1400 ppm or less.

The nitrogen atomic concentration in the synthetic single crystal diamond of the present disclosure may be adjusted to 200 ppm or more and 1300 ppm or less.

The nitrogen atomic concentration in the synthetic single crystal diamond of the present disclosure may be adjusted to 300 ppm or more and 1500 ppm or less.

The nitrogen atomic concentration in the synthetic single crystal diamond of the present disclosure may be adjusted to 300 ppm or more and 1400 ppm or less.

The nitrogen atomic concentration in the synthetic single crystal diamond of the present disclosure may be adjusted to 300 ppm or more and 1300 ppm or less.

[Addendum 5]

In the synthetic single crystal diamond of the present disclosure, the (λ'−λ) may be adjusted to 0 or more and 2 or less.

In the synthetic single crystal diamond of the present disclosure, the (λ'−λ) may be adjusted to 0 or more and 1 or less.

In the synthetic single crystal diamond of the present disclosure, the (λ'−λ) may be adjusted to 0.05 or more and 2 or less.

In the synthetic single crystal diamond of the present disclosure, the (λ'−λ) may be adjusted to 0.05 or more and 1 or less.

In the synthetic single crystal diamond of the present disclosure, the (λ'−λ) may be adjusted to 0.1 or more and 2 or less.

In the synthetic single crystal diamond of the present disclosure, the (λ'−λ) may be adjusted to 0.1 or more and 1 or less.

In the synthetic single crystal diamond of the present disclosure, the (λ'−λ) may be adjusted to 0.15 or more and 2 or less.

In the synthetic single crystal diamond of the present disclosure, the (λ'−λ) may be adjusted to 0.15 or more and 1 or less.

In the synthetic single crystal diamond of the present disclosure, the (λ'−λ) may be adjusted to 0.2 or more and 2 or less.

In the synthetic single crystal diamond of the present disclosure, the (λ'−λ) may be adjusted to 0.2 or more and 1 or less.

In the synthetic single crystal diamond of the present disclosure, the (λ'−λ) may be adjusted to 0.25 or more and 2 or less.

In the synthetic single crystal diamond of the present disclosure, the (λ'−λ) may be adjusted to 0.25 or more and 1 or less.

In the synthetic single crystal diamond of the present disclosure, the (λ'−λ) may be adjusted to 0.3 or more and 2 or less.

In the synthetic single crystal diamond of the present disclosure, the (λ'−λ) may be adjusted to 0.3 or more and 1 or less.

EXAMPLES

The present disclosure will be described in more detail with reference to examples. However, the scope of the present disclosure is not limited to these examples.

[Production of Synthetic Single Crystal Diamond]

<Sample 2 and Sample 4 to Sample 7>

(First Step)

Diamond single crystals are synthesized in a sample chamber having the configuration illustrated in FIG. 2 by the temperature difference process using a solvent metal.

As the solvent metal, an alloy composed of iron, cobalt and nickel is prepared, and to the solvent metal, iron nitride ($Fe_3N$) powder is added as a nitrogen source. The concentrations of the iron nitride in the solvent metal are shown in the column “concentration of iron nitride in solvent metal (mass %)” of “production conditions” in Table 1. For example, in Sample 2, the concentration of the iron nitride in the solvent metal is 0.02 mass %.

Diamond powder is used as the carbon source, and approximately 0.5 mg of diamond single crystal is used as the seed crystal. The temperature in the sample chamber is adjusted by using a heater so that a temperature difference of several tens of degrees is created between the high temperature portion where the carbon source is placed and the low temperature portion where the seed crystal is placed. In addition, an ultrahigh pressure generator is used to control the pressure to 5.5 GPa and the temperature of the low temperature portion in the range of 1370° C.±10° C. (1360° C. to 1380° C.), and the controlled pressure and temperature are kept for 60 hours, and thereby the diamond single crystals are synthesized on the seed crystal.

(Second Step)

Next, the obtained diamond single crystals are irradiated with an electron beam. The irradiation condition is set to include an irradiation energy of 4.6 MeV, a current of 2 mA, and an irradiation time of 30 hours. This irradiation condition is the same as the irradiation condition for applying an energy of 100 MGy to a diamond single crystal.

(Third Step)

Next, temperatures shown in the column "third step (60 minutes)" of "production conditions" in Table 1 are applied to the diamond single crystals that have been irradiated with an electron beam under normal pressure (sample 4) or under a high pressure of 3 GPa or more (sample 2 and sample 5 to sample 7, expressed as "high pressure" in Table 1) for 60 minutes, thereby obtaining synthetic single crystal diamonds. For example, for sample 2, a pressure of 3 GPa or more (high pressure) and a temperature of 2300° C. are applied to the diamond single crystal for 60 minutes.

<Sample 1>

For sample 1, a diamond single crystal is synthesized by the same first step as for sample 2. For sample 1, the second step and the third step are not performed.

<Sample 3>

For sample 3, a diamond single crystal is synthesized by the same first step as for sample 4. For sample 1, the second step and the third step are not performed.

TABLE 1

| | Production conditions | | |
|---|---|---|---|
| Sample No. | Concentration of iron nitride in solvent metal (mass %) | Irradiation with electron beam (100 MGy) | Third step (60 minutes) |
| 1 | 0.02 | Non-operated | Non-operated |
| 2 | 0.02 | Operated | High pressure 2300° C. |
| 3 | 0.08 | Non-operated | Non-operated |
| 4 | 0.08 | Operated | Normal pressure 1800° C. |
| 5 | 0.08 | Operated | High pressure 2300° C. |
| 6 | 0.1 | Operated | High pressure 2300° C. |
| 7 | 0.1 | Operated | High pressure 2250° C. |

<Evaluation>

The synthetic single crystal diamonds of sample 2 and sample 4 to sample 7 and the diamond single crystals of sample 1 and sample 3 (hereinafter, also referred to as "synthetic single crystal diamond/diamond single crystal") were subject to measurement of nitrogen atomic concentration, Raman spectroscopy, measurement of fluorescent spectrum, infrared spectroscopy, measurement of Knoop hardness, and breaking strength test.

(Determination of Nitrogen Atomic Concentration)

The nitrogen atomic concentration based on atom numbers in the synthetic single crystal diamond/diamond single crystal of each sample is determined by SIMS analysis. The results are shown in the column "nitrogen atomic concentration (ppm)" of "synthetic single crystal diamond/diamond single crystal" in Table 2.

(Raman Spectroscopy)

The Raman shift $\lambda'$ $cm^{-1}$ of a peak in the first-order Raman scattering spectrum of the synthetic single crystal diamond/diamond single crystal of each sample and the Raman shift $\lambda$ $cm^{-1}$ of a peak in the first-order Raman scattering spectrum of the synthetic type IIa single crystal diamond containing nitrogen atoms at a concentration of 1 ppm or less based on atom numbers (high-purity type IIa single crystal diamond manufactured by Sumitomo Electric Industries, Ltd.) are measured by the microscopic Raman spectroscopy and the value of $(\lambda'-\lambda)$ is calculated. A specific measurement method is described in Embodiment 1 and thus will not be repeatedly described. The results are shown in the column "$\lambda'-\lambda$ ($cm^{-1}$)" of "Raman spectrum" of "synthetic single crystal diamond/diamond single crystal" in Table 2.

(Fluorescent Spectrum)

The surface of the synthetic single crystal diamond/diamond single crystal of each sample is mirror-polished and then irradiated with excitation light having the wavelength of 325 nm to measure the fluorescent spectrum.

In the fluorescent spectrum, the presence or absence of a luminescence peak in the fluorescent wavelength range of 415±2 nm and the presence or absence of a luminescence peak in the fluorescent wavelength range of 420 nm or more and 470 nm or less are confirmed. The results are shown in the columns "luminescence peak in range of 415±2 nm (luminescence intensity)" and "420 to 470 nm subband (maximum luminescence peak)" of "fluorescent spectrum" of "synthetic single crystal diamond/diamond single crystal" in Table 2.

When a luminescence peak is "present" in the fluorescent wavelength range of 415±2 nm, the luminescence intensity of the peak is shown in the parenthesis ( ). However, it does not mean that the luminescence intensity corresponds to the content of the N3 center (the luminescence intensity varies according to the state of other impurities or crystal defects).

When a luminescence peak is "present" in the fluorescent wavelength range of 420 nm or more and 470 nm or less, the maximum luminescence intensity of the peak is shown in the parenthesis ( ). However, it does not mean that the maximum luminescence intensity corresponds to the content of the N3 center (the luminescence intensity varies according to the state of other impurities or crystal defects).

In all of the samples where a luminescence peak is "present" in the fluorescent wavelength range of 415±2 nm (sample 2 and sample 5 to sample 7), a luminescence peak is also confirmed in the fluorescent wavelength range of 420 nm or more and 470 nm or less.

In all of the samples where a luminescence peak is "absent" in the fluorescent wavelength range of 415±2 nm (sample 1, sample 3 and sample 4), a luminescence peak is not confirmed in the fluorescent wavelength range of 420 nm or more and 470 nm or less.

When a luminescence peak is present in one or both of in the fluorescent wavelength range of 415±2 nm and in the fluorescent wavelength range of 420 nm or more and 470 nm or less, the N3 center is regarded as being "present", and, when no luminescence peak is present in both of the ranges, the N3 center is regarded as being "absent". The results are shown in the column "N3 center" of "fluorescent spectrum" of "synthetic single crystal diamond/diamond single crystal" in Table 2.

(Infrared Spectroscopy)

After machining the synthetic single crystal diamond/diamond single crystal of each sample into a plate with a thickness of approximately 1 mm and polishing two surfaces that transmit light to mirror surfaces, the absorbance is measured in the infrared region with a Fourier transform infrared spectroscopy to prepare an infrared absorption spectrum.

When an absorption peak except absorption attributed to other centers is present at the wave number of 1282±2 $cm^{-1}$ in the infrared absorption spectrum, the A center is regarded as being "present", and, when no absorption peak is present at the wave number of 1282±2 $cm^{-1}$, the A center is regarded as being "absent". The results are shown in the column "A center" of "infrared absorption spectrum" of "synthetic single crystal diamond/diamond single crystal" in Table 2.

When an absorption peak except absorption attributed to other centers is present at the wave number of 1175±2 $cm^{-1}$ in the infrared absorption spectrum, the B center is regarded as being "present", and, when no absorption peak is present at the wave number of 1175±2 $cm^{-1}$, the B center is regarded as being "absent". The results are shown in the column "B center" of "infrared absorption spectrum" of "synthetic single crystal diamond/diamond single crystal" in Table 2.

When an absorption peak except absorption attributed to other centers is present at the wave number of 1130±2 $cm^{-1}$ in the infrared absorption spectrum, the C center is regarded as being "present", and, when no absorption peak is present at the wave number of 1130±2 $cm^{-1}$, the C center is regarded as being "absent". The results are shown in the column "C center" of "infrared absorption spectrum" of "synthetic single crystal diamond/diamond single crystal" in Table 2.

When an absorption peak except absorption attributed to other centers is present at the wave number of 1370 to 1385 $cm^{-1}$ in the infrared absorption spectrum, the B' center (platelets) is regarded as being "present", and, when no absorption peak is present at the wave number of 1370 to 1385 $cm^{-1}$, the B' center (platelets) is regarded as being "absent". The results are shown in the column "B' center/platelets" of "infrared absorption spectrum" of "synthetic single crystal diamond/diamond single crystal" in Table 2.

The synthetic single crystal diamond containing the B' center (platelets) shows an absorption peak at the wave number of 1358 $cm^{-1}$ or more and 1385 $cm^{-1}$ or less in the infrared absorption spectrum. However, when an absorption peak is present in the range smaller than the wave number of 1370 $cm^{-1}$ (the wave number of 1358 $cm^{-1}$ or more and less than 1370 $cm^{-1}$), the B' center (platelets) aggregate in the crystal is too large and acts as a starting point of breaking, which is not preferable. For sample 1 to sample 7, no absorption peak is present at the wave number of 1358 $cm^{-1}$ or more and less than 1370 $cm^{-1}$.

As the reference values, the value of the absorbance at the wave number of 1282 $cm^{-1}$ (A center), the value of the absorbance at the wave number of 1175 $cm^{-1}$ (B center), the value of the absorbance at the wave number of 1130 $cm^{-1}$ (C center), the value of the absorbance of a peak at the wave number of 1370 $cm^{-1}$ or more and 1385 $cm^{-1}$ or less, and the value of the absorbance of a peak at the wave number of 1358 $cm^{-1}$ or more and 1370 $cm^{-1}$ or less when the absorbance at the wave number of 2160 $cm^{-1}$, which is absorption attributed to the phonon of diamond taken as 1 are calculated. The results are shown in the columns "I (1282)/I (2160)", "I (1175)/I (2160)", "I (1130)/I (2160)", "I (1370-1385)/I (2160)", and "I (1358-1370)/I (2160)" of "infrared absorption spectrum" of "synthetic single crystal diamond/diamond single crystal" in Table 2.

Regarding I (1282)/I (2160), the value of I (1282)/I (2160) is larger in sample 3 where the A center is "absent" than in sample 2 where the A center is "present". This is because sample 3 contains much nitrogen of the C center and thus absorption at the wave number of 1282 $cm^{-1}$ derived from the shoulder of the absorption spectrum of this C center is strong, and this does not indicate that sample 3 contains the A center.

Regarding I (1175)/I (2160), the value of I (1175)/I (2160) is larger in sample 2, sample 4 and sample 5 where the B center is "present" than in sample 3 where the B center is "absent". This is because sample 3 contains much nitrogen of the C center and thus absorption at the wave number of 1175 $cm^{-1}$ derived from the shoulder of the absorption spectrum of this C center is strong, and this does not indicate that sample 3 contains the B center.

Regarding I (1130)/I (2160), the value of I (1130)/I (2160) is larger in sample 4 to sample 7 where the C center is "absent" than in sample 1 where the C center is "present". This is because sample 4 to sample 7 contain much nitrogen of the A center and the B center and thus absorption at the wave number of 1130 $cm^{-1}$ derived from the shoulder of the absorption spectrum of these A center and B center is strong, and this does not indicate that sample 4 to sample 7 contain the C center.

(Measurement of Knoop Hardness)

An indentation is made with a load of 4.9 N in the <100> direction in the {001} plane of the synthetic single crystal diamond/diamond single crystal of each sample. The long diagonal line "a" (μm) of the obtained indentation is measured, and the Knoop hardness (HK) is calculated by the following expression A. The results are shown in the column "{001}<100> Knoop hardness" of "synthetic single crystal diamond/diamond single crystal" in Table 2.

$$HK=14229\times 4.9/a^2 \quad \text{Expression A}$$

(Breaking Strength Test)

A spherical diamond indenter having R of 50 μm is prepared, a load is applied to the synthetic single crystal diamond/diamond single crystal of each sample at a loading speed of 100 N/min at room temperature (23° C.), and the load at the moment when a crack occurred in the sample (cracking load) is measured. A specific measurement method is described in Embodiment 1 and thus will not be repeatedly described. The larger the cracking load, the higher the strength of the sample and the better the breakage resistance. The results are shown in the column "cracking load" of "synthetic single crystal diamond/diamond single crystal" in Table 2.

TABLE 2

| | Synthetic single crystal diamond/diamond single crystal | | | | | | | | | | | | | | | |
|---|---|---|---|---|---|---|---|---|---|---|---|---|---|---|---|---|
| | Fluorescent spectrum | | Infrared absorption spectrum | | | | | | | | | | | | | |
| Sample No. | Luminescence peak in range of 415 ± 2 nm | 420 to 470 nm sub-band | N3 center | $I_{(1282)}/I_{(2160)}$ | A center | $I_{(1175)}/I_{(2160)}$ | B center | $I_{(1130)}/I_{(2160)}$ | C center | $I_{(1370\text{-}1385)}/I_{(2160)}$ | $I_{(1358\text{-}1370)}/I_{(2160)}$ | B' center/ platelets | Raman spectrum ($\lambda' - \lambda$) ($cm^{-1}$) | Nitrogen atomic concentration (ppm) | {001} <100> Knoop hardness (GPa) | Cracking load (N) |
| 1 | Absent | Absent | Absent | 0.15 | Absent | 0.27 | Absent | 0.44 | Present | 0 | 0 | Absent | −0.08 | 150 | 95 | 9 |
| 2 | Present (4912) | Present (5200) | Present | 0.55 | Present | 0.25 | Present | 0.18 | Absent | 0 | 0 | Absent | 0.05 | 150 | 112 | 17 |
| 3 | Absent | Absent | Absent | 0.6 | Absent | 1.35 | Absent | 2.2 | Present | 0 | 0 | Absent | −0.12 | 800 | 90 | 6 |
| 4 | Absent | Absent | Absent | 2.79 | Present | 1.31 | Present | 0.64 | Absent | 0 | 0 | Absent | 0.25 | 800 | 95 | 15 |
| 5 | Present (3800) | Present (4150) | Present | 2.87 | Present | 1.30 | Present | 0.64 | Absent | 0.003 | 0 | Present | 0.3 | 800 | 105 | 25 |
| 6 | Present (4500) | Present (4700) | Present | 3.4 | Present | 1.38 | Present | 0.8 | Absent | 0.01 | 0 | Present | 0.32 | 1000 | 128 | 30 |
| 7 | Present (4700) | Present (4950) | Present | 4 | Present | 1.6 | Present | 0 | Absent | 0.02 | 0 | Present | 0.4 | 1500 | 132 | 30 |

<Consideration>

Sample 2 and sample 5 to sample 7 correspond to examples. Sample 1, sample 3 and sample 4 correspond to comparative examples. It is confirmed that sample 2 and sample 5 to sample 7 (examples) have high hardness and excellent breakage resistance compared with sample 1, sample 3 and sample 4 (comparative examples).

Among the examples, sample 5 to sample 7 have particularly high hardness and excellent breakage resistance. This is considered to be because, in sample 5 to sample 7, the C center (isolated substitutional nitrogen atoms) bringing about a decrease in hardness or strength is not present and platelets contributing to suppression of the plastic deformation or progress of cracks are present.

The embodiment and the examples of the present disclosure have been described as described above, and originally, appropriate combinations or various modifications of the configurations of individual embodiments and Examples described above are also planned.

It should be understood that the embodiments and examples disclosed herein have been presented for the purpose of illustration and description but not limited in all aspects. It is intended that the scope of the present invention is defined by the scope of the claims, rather than the embodiments and examples described above, and encompasses all modifications within the scope and meaning equivalent to the scope of the claims.

REFERENCE SIGNS LIST

1: diamond single crystal; 2: insulator; 3: carbon source; 4: solvent metal; 5: seed crystal; 6: pressure medium; 7: graphite heater; 10: sample chamber

The invention claimed is:

1. A synthetic single crystal diamond containing nitrogen atoms at a concentration of 100 ppm or more and 1500 ppm or less based on atom numbers, wherein the synthetic single crystal diamond contains aggregates each composed of one vacancy and three substitutional nitrogen atoms present adjacent to the vacancy, and wherein a Raman shift $\lambda'$ $cm^{-1}$ of a peak in a first-order Raman scattering spectrum of the synthetic single crystal diamond and a Raman shift $\lambda$ $cm^{-1}$ of a peak in a first-order Raman scattering spectrum of a synthetic type IIa single crystal diamond containing nitrogen atoms at a concentration of 1 ppm or less based on atom numbers show a relationship of the following formula 1, $$\lambda'-\lambda \geq 0.26 \quad \text{Formula 1.}$$

2. The synthetic single crystal diamond according to claim 1, wherein, in a fluorescent spectrum of the synthetic single crystal diamond, a luminescence peak is present in one or both of the fluorescence wavelength range of 415±2 nm and the fluorescence wavelength range of 420 nm or more and 470 nm or less.

3. The synthetic single crystal diamond according to claim 1, wherein, in an infrared absorption spectrum of the synthetic single crystal diamond, an absorption peak is present in the wave number range of 1370 $cm^{-1}$ or more and 1385 $cm^{-1}$ or less.

4. The synthetic single crystal diamond according to claim 1, wherein the synthetic single crystal diamond has a Knoop hardness of 100 GPa or more in a <100> direction in a {001} plane.

5. The synthetic single crystal diamond according to claim 1, wherein the synthetic single crystal diamond has a cracking load of 15 N or more in a breaking strength test in which a spherical diamond indenter having a tip radius of 50 μm is pressed against a surface of the synthetic single crystal diamond at a loading speed of 100 N/min.

6. A method for manufacturing the synthetic single crystal diamond according to claim 1, the method comprising:

a first step of synthesizing a diamond single crystal containing nitrogen atoms at a concentration of 100 ppm or more and 1500 ppm or less based on atom numbers by a temperature difference process using a solvent metal;

a second step of irradiating the diamond single crystal with one or both of an electron beam and a particle beam with an energy of 100 MGy or more and 1000 MGy or less; and a third step of obtaining the synthetic single crystal diamond by applying a pressure of 3 GPa or more and a temperature of 1850° C. or more and 2300° C. or less for one minute or more and 3600 minutes or less to the diamond single crystal after the second step.

* * * * *